(12) United States Patent  
Vernickel et al.

(10) Patent No.: US 11,269,033 B2  
(45) Date of Patent: Mar. 8, 2022

(54) SHIM IRONS FOR A MAGNETIC RESONANCE APPARATUS

(71) Applicant: KONINKLIJKE PHILIPS N.V., Eindhoven (NL)

(72) Inventors: Peter Vernickel, Hamburg (DE); Ingo Schmale, Hamburg (DE); Oliver Lips, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/046,785

(22) PCT Filed: Apr. 2, 2019

(86) PCT No.: PCT/EP2019/058296  
§ 371 (c)(1),  
(2) Date: Oct. 11, 2020

(87) PCT Pub. No.: WO2019/197221  
PCT Pub. Date: Oct. 17, 2019

(65) Prior Publication Data  
US 2021/0181280 A1     Jun. 17, 2021

(30) Foreign Application Priority Data  
Apr. 12, 2018   (EP) .................................... 18166915

(51) Int. Cl.  
*G01R 33/3873*     (2006.01)  
*G01R 33/38*       (2006.01)

(52) U.S. Cl.  
CPC ..... *G01R 33/3873* (2013.01); *G01R 33/3802* (2013.01)

(58) Field of Classification Search  
USPC ......................................................... 324/319  
See application file for complete search history.

(56) References Cited

U.S. PATENT DOCUMENTS 5,463,363 A   10/1995  Ogawa  
5,555,251 A    9/1996  Kinanen  
(Continued)

FOREIGN PATENT DOCUMENTS

JP      09238917 H    9/1997  
JP      2003203813 A  7/2003  
(Continued)

OTHER PUBLICATIONS

El-Sharkawy AM, Schar M, Bottomley PA, Atalar E. Monitoring and correcting spatio-temporal variations of the MR scanner's static magnetic field. Magma. 2006;19(5):223-236.

(Continued)

*Primary Examiner* — Rodney E Fuller (57) ABSTRACT

The invention relates to a shim iron (130) for use with an magnetic resonance (MR) apparatus (10), wherein the shim iron (130) is comprised of a stack of shim plates (131, 132, 133, 134, 135), wherein at least two of the shim plates (131, 132, 133, 134, 135) comprise slits, the slits forming a respective slit pattern of the slit shim plates (131, 132, 133, 134, 135), and wherein the slit patterns, when viewed from the same viewing direction, are comprised of at least two different slit patterns which may not be brought into congruent coverage with each other. In this way, a shim iron (130) is provided which does not heat up to high temperatures due to eddy currents.

12 Claims, 4 Drawing Sheets

(56) References Cited

U.S. PATENT DOCUMENTS

| | | | |
|---|---|---|---|
| 5,635,839 A | 6/1997 | Srivastava et al. |
| 6,150,819 A | 11/2000 | Laskaris et al. |
| 6,627,003 B2 | 9/2003 | Hayworth et al. |
| 6,731,113 B2 | 5/2004 | Ham et al. |
| 6,778,054 B1 | 8/2004 | Huang et al. |
| 6,853,855 B2 | 2/2005 | Ideler |
| 6,867,592 B2 | 3/2005 | Gebhardt et al. |
| 6,906,606 B2 | 6/2005 | Jacobs |
| 7,741,847 B2 | 6/2010 | Nakabayashi et al. |
| 8,536,869 B2 | 9/2013 | Kawamoto |
| 2006/0262826 A1 | 11/2006 | Dietz et al. |
| 2009/0211080 A1 | 8/2009 | Gowland et al. |
| 2010/0320843 A1 | 12/2010 | Kitamura et al. |
| 2012/0098538 A1 | 4/2012 | Shen et al. |
| 2012/0286785 A1 | 11/2012 | Besio et al. |
| 2014/0062484 A1 | 3/2014 | Kwak et al. |
| 2016/0091576 A1 | 3/2016 | Tomiha et al. |

FOREIGN PATENT DOCUMENTS

| | | |
|---|---|---|
| JP | 215211766 A | 11/2015 |
| JP | 2015208427 A | 11/2015 |
| JP | 2015211766 A | 11/2015 |
| JP | 2016116804 A | 6/2016 |

OTHER PUBLICATIONS

Wachowicz K. Evaluation of active and passive shimming in magnetic resonance imaging. Research and Reports in Nuclear Medicine. 2014;4:1-12 https://doi.org/10.2147/RRNM.S46526.

Foerster et al. "Magnetic field shift due to mechanical vibration in functional magnetic resonance imaging", Magn Reson Med. 2005;54(5):1261-1267.

International Search Report and Written Opinion from PCT/EP2019/058296 dated Oct. 17, 2019.

SHIM IRONS FOR A MAGNETIC RESONANCE APPARATUS

CROSS REFERENCE TO RELATED APPLICATIONS

This application is a U.S. national phase application of International Application No. PCT/EP2019/058296 filed Apr. 2, 2019, which claims the benefit of EP Application Serial No. 18166915.1 filed on Apr. 12, 2018 and is incorporated herein by reference.

FIELD OF THE INVENTION

The invention relates to the field of shim irons for use with a magnetic resonance (MR) apparatus, and in particular to shim irons which are comprised of a stack of shim plates which are slit in order to reduce heating of the shim irons due to eddy currents.

BACKGROUND OF THE INVENTION

In nuclear magnetic resonance (NMR) and magnetic resonance imaging (MRI), shimming is used prior to the operation of the magnet to eliminate inhomogeneities in its static magnetic field. Initially, the magnetic field inside an NMR spectrometer or MRI scanner is far from homogeneous compared with an "ideal" field of the device. This is a result of production tolerances and of the environment of the scanner. Iron constructions in walls and floor of the examination room become magnetized and disturb the field of the scanner. The probe and the sample or the patient become slightly magnetized when brought into the strong magnetic field and create additional inhomogeneous fields. The process of correcting for these inhomogeneities is called shimming the magnet, shimming the probe or shimming the sample, depending on the assumed source of the remaining inhomogeneity. Field homogeneity of the order of 1 ppm over a volume of several liters is needed in an MRI scanner. High-resolution NMR spectroscopy demands field homogeneity better than 1 ppb within a volume of a few milliliters.

In general, there are two types of shimming: active shimming and passive shimming. Active shimming uses coils with adjustable current. Passive shimming involves pieces of steel with suitable magnetic properties, also called shim irons. The shim irons are placed near the permanent or superconducting magnet. They become magnetized and produce their own magnetic field. In both cases, the additional magnetic fields from the coils or shim irons, respectively, add to the overall magnetic field of the superconducting magnet in such a way as to increase the homogeneity of the total field.

Typically, a MRI scanner comprises a field-generating unit (both B0+gradients), which has openings along the longitudinal axis into which shim rails are inserted. These shim rails have various pockets into which shim irons are placed. In present MRI scanners, shim irons are typically placed at locations where the gradient field is close to maximum. Further, in such a configuration, the shim irons are mechanically connected to the gradient-generating unit which is prone to vibration, rather than to the B0-generating unit (the inner hull of the cryostat), which is rather static. Therefore, the recent deployment of such MRI scanners leads to an aggravation of a problem long known, i.e. the heating of the shim irons and hence the thermal drift of the shimming.

This means that though by careful passive shimming very good static homogeneity of the main magnetic field may be achieved, there is a disadvantage of this technique in that the shim material is temperature sensitive, and when the bore heats (as it commonly does with gradient-intensive sequences), field shifts may occur. Heating of the shim plates is mainly caused by eddy currents. A time variant magnetic flux (the gradient field) induces currents in the shim plates which heat the shim plates. Hence, changes in temperature will cause the magnetic distribution created by the passive shims to change, with potentially detrimental effects on image quality and geometric accuracy. The implementation of passive shims must therefore proceed only with the awareness that their proper functioning depends on stable temperature conditions.

Various attempts were therefore presented in patent literature to keep the temperature of the shim irons constant for the time of a imaging scan or imaging sequence, e.g. pre-heating them locally, special cooling directly for the shim irons, or by regulating the cooling on the outflow rather than the inflow temperature. Alternatively, materials or mixture of materials may be used, in which the negative thermal coefficient of the saturation of the magnetization of the iron is counteracted.

From U.S. Pat. No. 5,555,251 it is known that two opposite iron core pole pieces of a magnetic resonance medical imager generate a static magnetic field in a patient imaging volume disposed between the pole pieces. Gradient coils are positioned in the face of a pole piece. Thin disc shaped or ring shaped ferromagnetic parts laminated of layers cut favorably from transformer sheet material are attached to the face of the pole piece. Each layer is electrically insulated from adjacent layers and surfaces by enamel or fixing glue. To reduce eddy currents in these layers, narrow, radially oriented slots are cut in these layers before lamination. The slots are oriented in the adjacent layers so as not to coincide resulting in improved conduction of the magnetic flux in the imaging volume during the production of gradient magnetic fields by the gradient coils.

Shim plates provided with a cut (or slit) for suppression of eddy currents are known per se from the Japanese utility model JP-H09-238917.

SUMMARY OF THE INVENTION

It is an object of the invention to an easy and effective way for shimming a MR apparatus with a shim iron with substantially reduced heating caused by eddy currents induced by gradient fields.

According to the invention, this object is addressed by the subject matter of the independent claims. Preferred embodiments of the invention are described in the sub claims.

Therefore, according to the invention, a shim iron for use with a magnetic resonance (MR) apparatus is provided,
  wherein the shim iron is comprised of a stack of shim plates,
  wherein at least two of the shim plates comprise slits, the slits forming a respective slit pattern of the slit shim plates, and
  wherein of shim plates that are consecutive in the stack at least some of the slits are orientated differently.

According to the invention, is has been found that straight forward slitting works well for relatively small frequencies, however at higher frequencies (>1000 Hz) slitting even increases the losses. This seems to be due to the effect, that for high frequencies the shim plates cannot be treated in 2D, but rather in 3D. Thus, it has been found that consecutive shim plates should not comprise the same slit pattern, especially not a slit pattern for which slits of consecutive shim plates cover each other.

Hence, it is an essential idea of the invention to avoid such slit patterns of the different shim plates which, in general, would allow that consecutive shim plates of a stack of shim plates are in congruent coverage. This means that according to the invention it is avoided that the slits of consecutive shim plates of a stack are aligned in the same way. In this way, a shim iron comprised of such shim plates may be assembled in an easy and reliable way avoiding such direct coverage of slits of consecutive/neighboring shim plates.

Because the slits of the respective slit patterns of consecutive shim plates have different orientations in the plane of the shim plates, there are no slits of the respective shim plate that coincide, i.e. fall on top of each other, in the stack. This avoids that constructive superposition occurs of eddy currents in consecutive shim plates. Hence, heating due to eddy currents in the stack is counteracted, so that the shim iron is hardly sensitive to heating due to eddy currents in its plates. The different orientations of the slit patterns of consecutive shim plates may be achieved by providing different shim patterns of the respective shim plates that are not congruent for in-plane rotation over the plates' shape rotational symmetry angles. Accordingly, when the shim plates are stacked and aligned according to the plates shape, the slits of the respective pattern do not coincide, independently of the plates having orientations that differ by a rotational symmetry angle of the plates' shape. Hence, as long as the plates are stacked so that their shapes align, their slit pattern do not show coincident slits. Thus, during stacking, no special attention for the precise orientation of the shim plates, as long as their shapes align, is needed. An implementation that is particularly simple to manufacture is achieved by providing for respective shim plates a single slit pattern that has a rotational symmetry with respect to a rotational axis that is in-plane offset from the axis of rotation of the plate's shape rotational symmetry. Hence, relative rotations of respective shim plates in the stack cause the then relatively rotated shim patterns to have no coincident slits of the respective shim plates. Notably consecutive shim plates aligned in the stack need only to be rotated over an angle of rotational symmetry of the plates' shape to rotate the (equally shaped) shim patterns to have their slits at different respective orientations.

Fields generated by induced eddy currents on one shim plate superimpose constructively with that of neighboring (consecutive) plates. This insight has lead to the demand of breaking this constructive superposition. In this respect, the invention proposes to use shim plates with different types of slitting. The basic idea is to have different slitting patterns in every consecutive plate, so that by stacking the plates the slits do not coincide.

In general the invention allows that only part of the shim plates of the shim iron comprise slits. However, according to a preferred embodiment of the invention all of the shim plates comprise slits. Further, in general, the shim plates could be of different shapes. However, according to a preferred embodiment of the invention, the shim plates all have the same shape, which preferably is a rectangular shape. As set out further below, this allows for correct alignment of the slit patterns of the shim plates in an easy and reliable way when assembling a shim iron. Though rectangular shim plates could have the shape of squares, according to a preferred embodiment of the invention, the rectangular shim plates have sides with different lengths. This makes correct alignment of the shim plates even easier.

The positive effect of the invention may be achieved with different shapes of the slits themselves. However, according to a preferred embodiment of the invention, the slits all run straight. Though, in general the shim plates could have different thicknesses, according to a preferred embodiment of the invention all shim plates have the same thickness. The shim plates could also be made from different magnetizable materials. However, it is preferred that the shim plates are all made from the same magnetizable material. Preferably, consecutive shim plates are galvanically insulated from each other, preferably by insulation sheets having the same shape as the shim plates.

There are different ways to implement the invention. According to one preferred alternative all shim plates are slit in the same way, wherein the slit pattern, when viewed from one side of a respective shim plate, is different from the slit pattern when viewed from the other side of the shim plate. In this respect, the slim pattern is preferably asymmetric. Hence, though two shim plates have the same slit pattern, turning of one shim plate by 180° onto its other side yields another slit pattern which may not be brought in congruent coverage with the slit pattern of the other shim plate.

As an alternative to the solution mentioned above, according to a preferred embodiment of the invention, the slit patterns, independently from the viewing direction, are comprised of at least two different slit patterns which may not be brought into congruent coverage with each other. This means that the slit patterns are always different, no matter to which side a shim plate is turned or from which side it is viewed. With at least two different slit pattern which are shaped in this way a stack of shim plates may be assembled for which the slit patterns of consecutive shim plates are not in congruent coverage with each other.

In this respect, according to a preferred embodiment of the invention, all slit patterns comprise the same number of straight slits, the straight slits having the same relative angles to each other, wherein the orientation of the slits of the slit pattern of a second shim plate is given by an integer number of non-rational angle rotations, preferably Golden Angle rotations of each slit of the slit pattern of a first shim plate. In geometry, the Golden Angle is the smaller of the two angles created by sectioning the circumference of a circle according to the golden ratio, i.e. into two arcs such that the ratio of the length of the larger arc to the length of the smaller arc is the same as the ratio of the full circumference to the length of the larger arc. The Golden Angel can be approximated in degrees as 137.508°. In this way, it may be achieved in an easy and reliable way that the slit patterns of all shim plates of a shim iron, when viewed from the same viewing direction, are all different from each other.

The invention further relates to a shim rail with a plurality of pockets, wherein at least one pocket comprises a shim iron as described before.

The invention also relates to a MRI apparatus with a bore for accommodating a subject to examined and a field-generating unit surrounding the bore, wherein the field-generating unit comprises a plurality of openings which run parallel to the longitudinal axis of the bore and wherein at least one of the plurality of bores comprises a shim rail as described before.

Furthermore, the invention also relates to a method of shimming a MRI apparatus with at least one shim iron, comprising the following method steps:

providing at least two shim plates which comprise slits, the slits forming a respective slit pattern of the slit shim plates, wherein the slit patterns, when viewed from the same viewing direction, are comprised of at least two different slit patterns which may not be brought into congruent coverage with each other, assembling the at least one shim iron by stacking the at least two shim plates in such a way that the at least two shim plates are not in congruent coverage with each other, and mounting the at least one shim iron onto the MRI apparatus for shimming the MRI apparatus.

Preferably, the method comprises the additional method step of:

assembling the at least one shim iron by stacking the at least another shim plate onto the at least two shim plates in such a way that consecutive shim plates are not in congruent coverage with each other.

Finally, the invention also relates to a method of manufacturing a shim plate for a shim iron which is to be used in a MRI apparatus, comprising the following steps:

providing a first unslit shim plate, slitting the first unslit shim plate with a slim pattern which comprises a predetermined number of straight slits, the straight slits having a predetermined relative angels to each other, providing a second unslit shim plate, slitting the second unslit shim plate with a slim pattern which comprises the same predetermined number of straight slits as the first shim plate, the straight slits having a the same predetermined relative angels to each other as the first shim plate, wherein the orientation of the slits of the slit pattern of the second shim plate is given by an integer number of non-rational angle rotations, preferably Golden Angle rotations, of each slit of the slit pattern of the first shim plate.

BRIEF DESCRIPTION OF THE DRAWINGS

These and other aspects of the invention will be apparent from and elucidated with reference to the embodiments described hereinafter. Such an embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
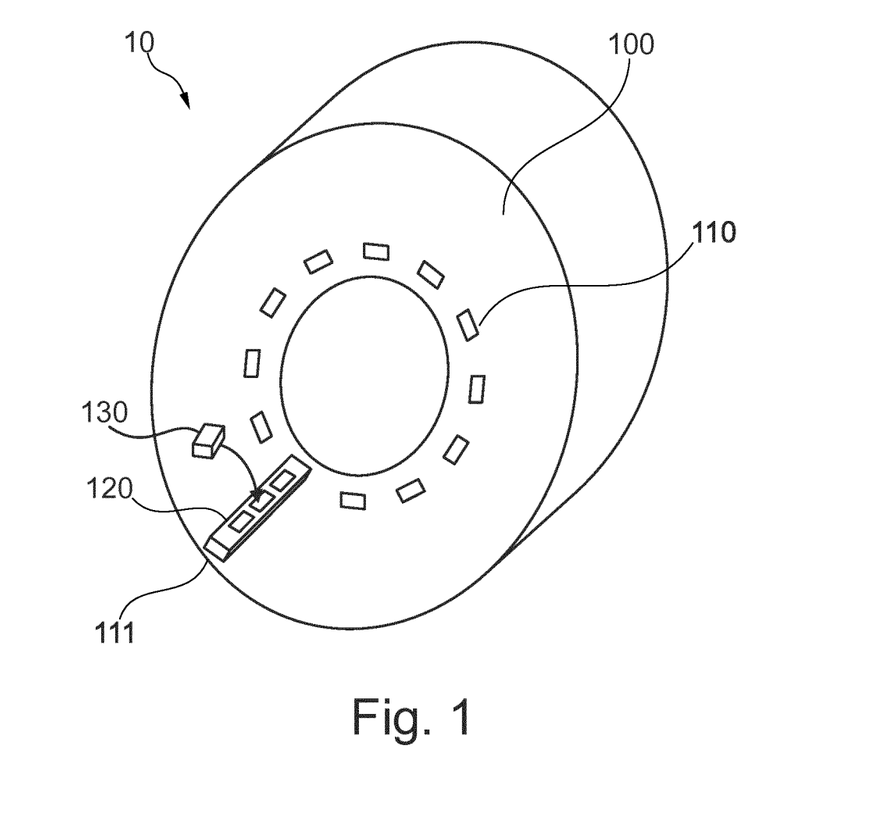
FIG. 1 schematically depicts a MRI scanner according to a preferred embodiment of the invention.

FIG. 1 schematically shows a MRI scanner 10 according to a preferred embodiment of the invention. It comprises of a field-generating unit 100 (both B0+gradients), which has openings 110 along the longitudinal axis, into which shim rails 111 are inserted. These shim rails 111 have various pockets 120 into which shim irons 130 are placed.

Figure 2:
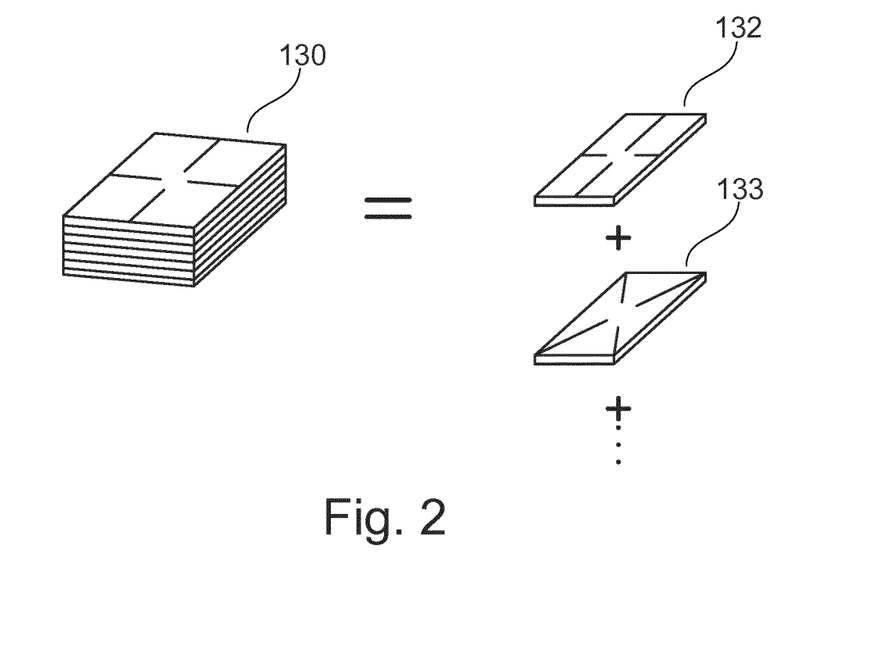
FIG. 2. schematically depicts a shim iron in the form of a blocks or stack of slit shim plates according to a preferred embodiment of the invention.

According to the preferred embodiment of the invention, there are more than one hundred pockets 120 per MR system where shim irons 130 in the form of blocks or stacks of slit shim plates 132, 133 as shown in FIG. 2 are placed. The amount of shim plates 132 per pocket 120 is determined in several iteration rounds to make the B0 field most homogeneous. A part of the so called shimming procedure is done on the customer site to compensate for ferromagnetic building parts and equipment in the vicinity of the MRI scanner 10.

Figure 3:
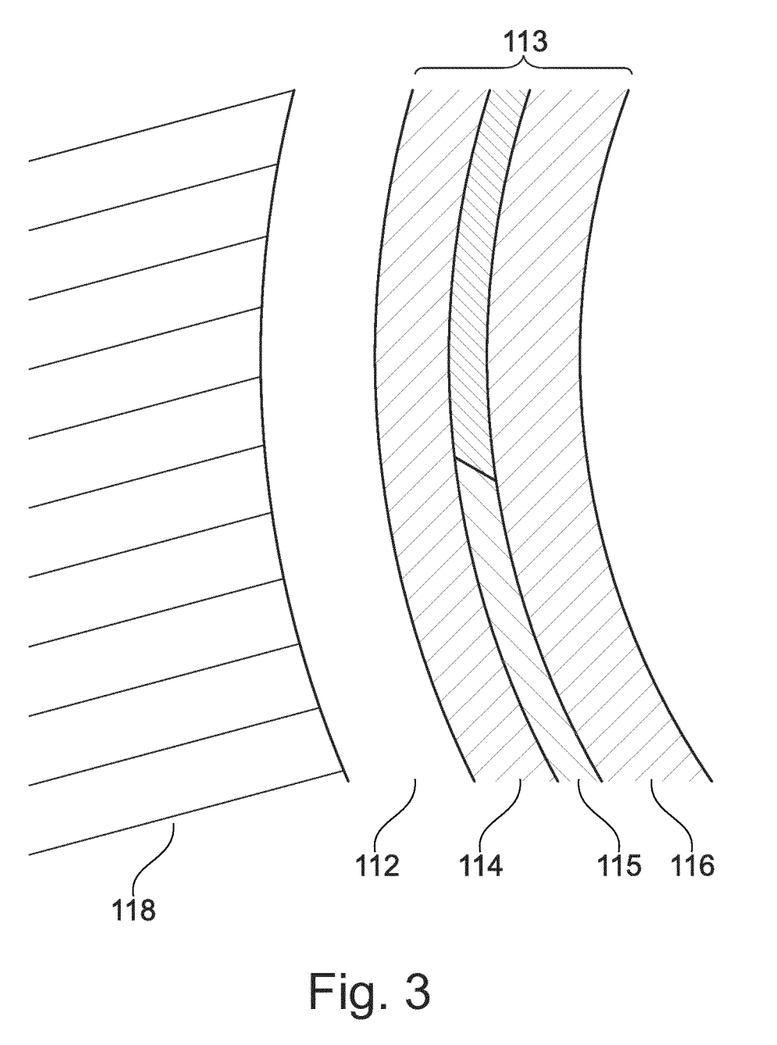
FIG. 3 shows an enlarged cross-sectional view of a part of the field-generating unit of the MRI scanner according to the preferred embodiment of the invention.

FIG. 3 shows an enlarged cross-sectional view of a part of the field-generating unit 100. It consists of an outer part of a B0-generating unit 111 (preferably a superconducting coil within a cryostat), into which a gradient-generating unit 113 is mounted. The gradient-generating unit 113 consists of a gradient coil 116 which is preferably actively shielded by a shielding coil 114, and a spacer 115 is located between them.

Figure 4:
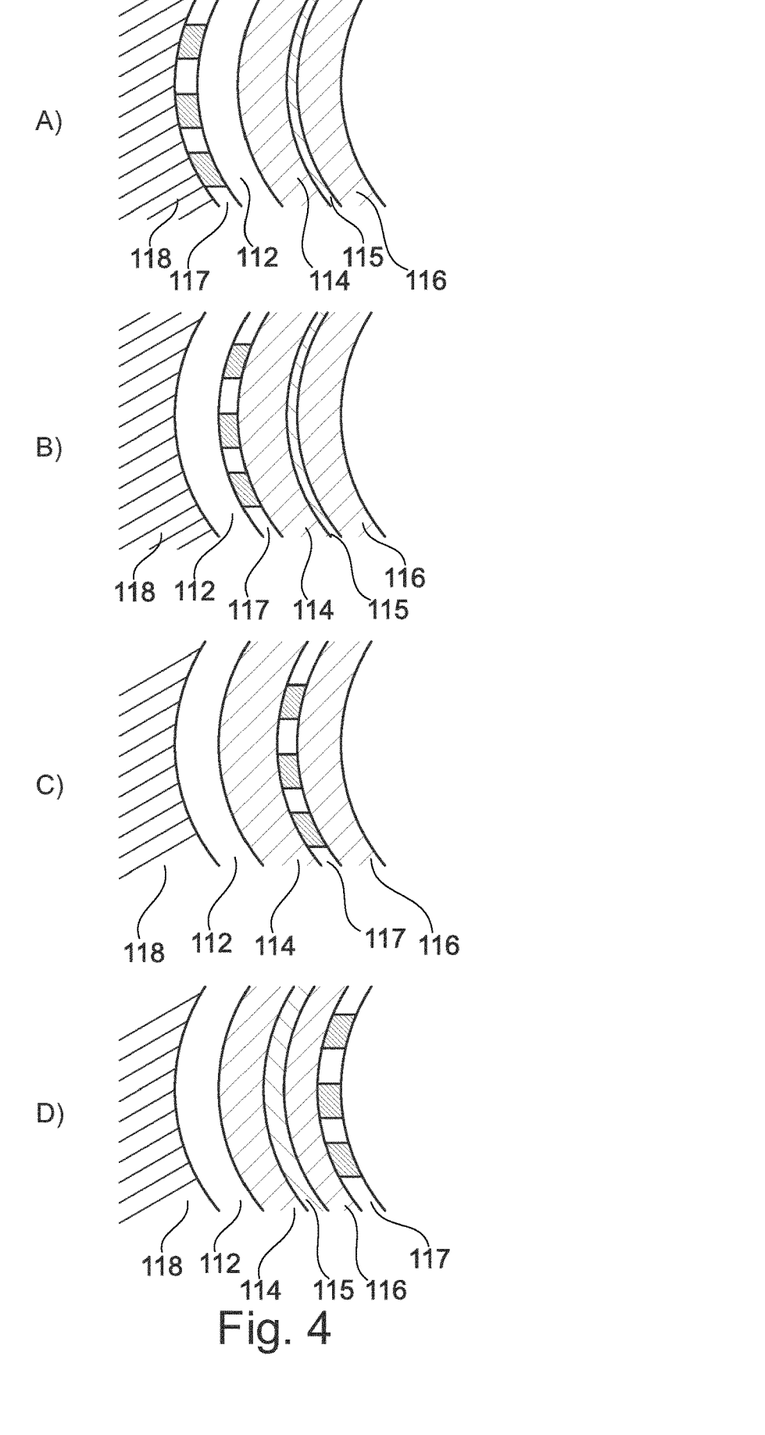
FIG. 4 schematically depicts possible locations for a cylindrically shaped layer into which the shim rails with the shim irons are mounted according to the preferred embodiment of the invention.

FIG. 4 shows possible locations for a cylindrically shaped layer 117 into which the shim rails 111 with the shim irons 130 are mounted. While option A is used in older scanners, option C is preferably used for the present preferred embodiment of the invention. Option C is chosen for its better space usage, allowing larger free-bore diameters (e.g. 70 cm) and hence accessibility also to obese patients. This space usage stems from the fact, that the spacer 115 is needed anyhow to separate coils 114 and 116, so this space can be used for the shim-iron layer 117, rather than wasted, as in all the other options. Further, in configuration C, the shim irons 130 are placed at the location where the gradient field is maximum. Furthermore, in this configuration, the shim irons 130 are mechanically connected to the gradient-generating unit 113, which is prone to vibration, rather than to the B0-generating unit 111 (the inner hull of the cryostat), which is rather static. Therefore, option C in MRI scanners leads to an aggravation of a problem long known, i.e. the heating up of the shim irons and hence the thermal drift of the shimming.

Figure 5:
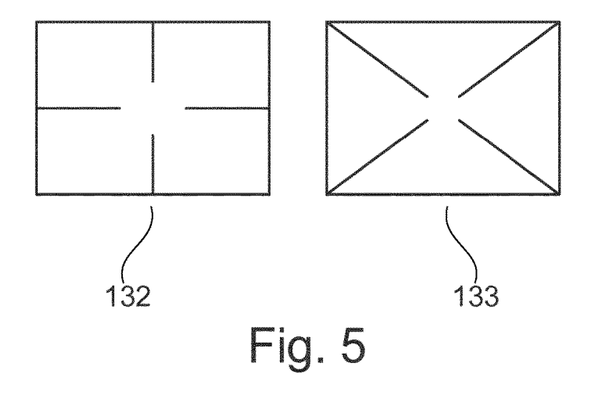
FIG. 5 schematically depicts shim plates according to a preferred embodiment of the invention.

According to the preferred embodiment of the invention, this problem is addressed by using slit shim plates 132, 133 wherein neighboring shim plates 132, 133 comprise such slit patterns which are not congruent to each other. This means that the slits of the slit shim plates 132, 133 do not run in such a way that a slit of one shim plate 132 is covered by a slit of another shim plate 133. An example of such slit patterns is shown in FIG. 5. Here, two types of slit patterns for the shim plates 132, 133 is provided. With a set of such different shim plates 132, 133 shim irons 130 may be stacked in which neighboring shim plates 132, 133 do not comprises congruent slit patterns. In this way, eddy currents in these shim irons 132, 133 are reduced and, hence, heating of the shim irons 130 is reduced.

Figure 6:
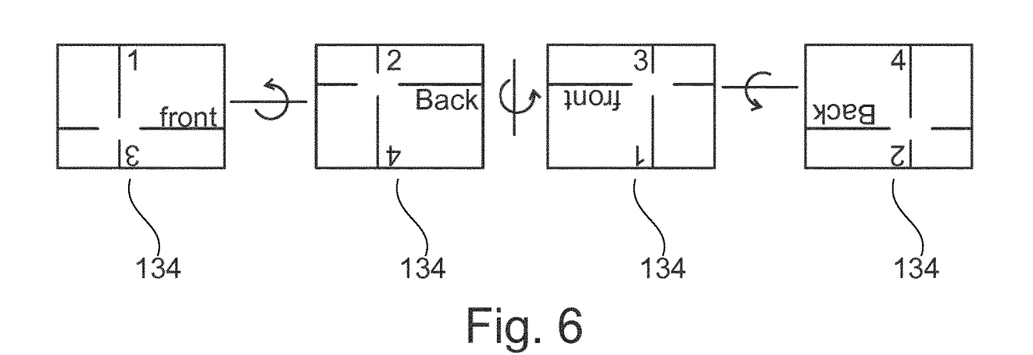
FIG. 6 schematically depicts shim plates according to another preferred embodiment of the invention.

Shim irons 130 in which neighboring shim plates 132, 133 do not comprises congruent slit patterns may also be stacked with the help of shim plates 134 which all comprise the same asymmetric slit pattern as shown in FIG. 6. Here, one shim plate 134 is shown which provides—from the same viewing angle—four different non-congruent slit patterns by turning the shim plate 134 from its back side to its front side and by turning the shim plate 134 by 180° along its normal axis which is indicated by "front" and "back" as well as "1", "2", "3", and "4" on both sides of the shim plate 134. Only one type of slitted shim plate has to be manufactured. The desired difference in the shim plates is achieved by rotating the plate around its axis.

Hence, numbering of the shim plates 134 as described before, or color coding of the shim plates 134 may be used so that workflow during shimming, i.e. stacking the shim plates 134 to generate a shim iron which fits the needs, is not affected to much. In the example of FIG. 6, a MR service engineer has to stack the plates so that the numbers 1→2→3→4→1 are consecutively readable when stacking the plates. The asymmetric "+"-slit pattern used here has the further advantage that an identical slitting pattern repeats at the 5th shim plate 134 instead of the 3rd shim plate 132, 133 as in FIG. 5 further improving the slitting efficiency.

Figure 7:
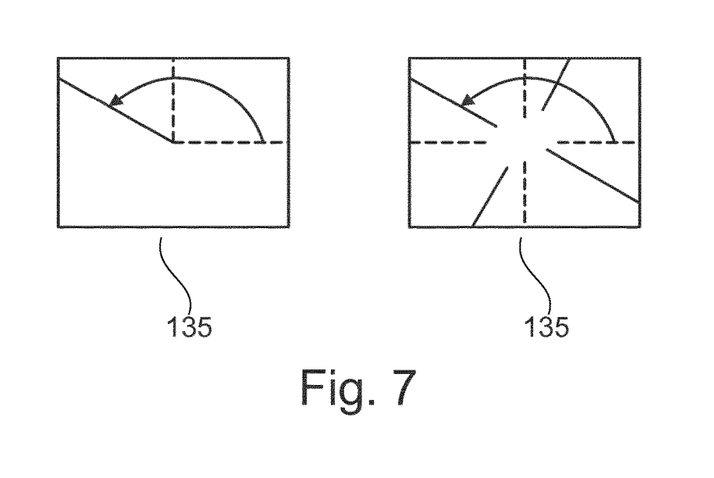
FIG. 7 schematically depicts shim plates according to still another preferred embodiment of the invention.

The preferred embodiment of FIG. 7 overcomes the problem of keeping the right order during stacking. Here, the slits of the shim plates 135 are punched with a non repeating pattern. The slit pattern is rotated with respect to the shim plate by a certain non-rational angle, like the Golden Angle ratio. In geometry, the Golden Angle is the smaller of the two angles created by sectioning the circumference of a circle according to the golden ratio, i.e. into two arcs such that the ratio of the length of the larger arc to the length of the smaller arc is the same as the ratio of the full circumference to the length of the larger arc. The Golden Angel can be approximated in degrees as 137.508°. This achieves that each shim plate is unique, numbering or coding is not required anymore. Thus the shimming procedure can be performed as it is done today, but the non-repeating slitting pattern will reduce the eddy-currents significantly. In addition to rotating the slitting pattern, its centre can also be slightly moved in order to reduce the size of the finally unslitted region in the centre. A further advantage of the proposed non-repeating, simple slitting pattern is, that it can be produced easily. The slitting pattern for each plate is simple and the rotation can be performed without difficulty.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope. Further, for the sake of clearness, not all elements in the drawings may have been supplied with reference signs.

REFERENCE SYMBOL LIST

MRI scanner 10
field-generating unit 100
openings 110
shim rails 111
air gap between cryostat and gradient coil 112
gradient-generating unit 113
shielding coil 114
spacer 115
gradient coil 116
cylindrically shaped layer 117
B0-generating unit 118
pockets 120
shim irons 130
shim plate 131
shim plate 132
shim plate 133
shim plate 134
shim plate 135

The invention claimed is:

1. A shim iron for use with a magnetic resonance (MR) apparatus,
the shim iron comprising:
a stack of shim plates,
wherein at least two of the shim plates include slits, the slits forming a respective slit pattern of the slit shim plates, and
wherein of shim plates that are consecutive in the stack at least some of the slits are orientated differently.

2. The shim iron according to claim 1, wherein at least two of the shim plates have different shim patterns that are not congruent for in-plane rotation over the plates' shape rotational symmetry angles.

3. The shim iron according to claim 1, wherein the shim plates have a slit pattern having with an in-plane rotational symmetry with respect to an axis of rotation of the slit pattern offset from the plates' shape in-plane rotational symmetry axis.

4. The shim iron according to claim 3, wherein the slim pattern is asymmetric with respect to one of more symmetry axis of the shape of the shim plate.

5. The shim iron according to claim 1, wherein the slit patterns, independently from the viewing direction, are comprised of at least two different slit patterns which may not be brought into congruent coverage with each other.

6. The shim iron according to claim 5, wherein all slit patterns comprise the same number of straight slits, the straight slits having the same relative angels to each other, wherein the orientation of the slits of the slit pattern of a second shim plate is given by an integer number of non-rational rotations of each slit of the slit pattern of a first shim plate.

7. The shim iron according to claim 5, wherein the slit patterns, when viewed from the same viewing direction, are all different from each other.

8. A shim rail with a plurality of pockets, wherein at least one pocket comprises a shim iron according to claim 1.

9. A magnetic resonance imaging (MRI) apparatus with a bore for accommodating a subject to examined and a field-generating unit surrounding the bore, wherein the field-generating unit comprises a plurality of openings which run parallel to the longitudinal axis of the bore and wherein at least one of the plurality openings comprises a shim rail according to claim 8.

10. A method of shimming a magnetic resonance imaging (MRI) apparatus with at least one shim iron, comprising:
providing at least two of the shim plates which comprise slits, the slits forming a respective slit pattern of the slit shim plates,
assembling the at least one shim iron by stacking the at least two shim plates in such a way that shim plates that are consecutive in the stack at least some of the slits are orientated differently, and
mounting the at least one shim iron into the MRI apparatus (10) for shimming the MRI apparatus.

11. The method according to claim 10, further comprising:
assembling the at least one shim iron by stacking the at least another shim plate onto the at least two shim plates in such a way that consecutive shim plates are not in congruent coverage with each other.

12. The method of manufacturing a shim plate for a shim iron which is to be used in a MRI apparatus, the method comprising:

providing a first unslit shim plate,
slitting the first unslit shim plate with a slit pattern which comprises a predetermined number of straight slits, the straight slits having a predetermined relative angels to each other,
providing a second unslit shim plate,
slitting the second unslit shim plate with a slim pattern which comprises the same predetermined number of straight slits as the first shim plate, the straight slits having a the same predetermined relative angels to each other as the first shim plate, wherein the orientation of the slits of the slit pattern of the second shim plate is given by an integer number of non-rational rotations of each slit of the slit pattern of the first shim plate.

* * * * *